(12) United States Patent
Kim et al.

(10) Patent No.: US 11,700,741 B2
(45) Date of Patent: Jul. 11, 2023

(54) DISPLAY DEVICE

(71) Applicant: Samsung Display Co., Ltd., Yongin-Si (KR)

(72) Inventors: Yun Jae Kim, Cheonan-si (KR); Jae Chun Park, Seoul (KR); Sang Wol Lee, Yongin-si (KR); Mun Sik Ham, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 248 days.

(21) Appl. No.: 16/940,902

(22) Filed: Jul. 28, 2020

(65) Prior Publication Data

US 2021/0050550 A1 Feb. 18, 2021

(30) Foreign Application Priority Data

Aug. 16, 2019 (KR) .......................... 10-2019-0100377

(51) Int. Cl.
*H10K 50/84* (2023.01)
*H10K 50/842* (2023.01)
*H10K 102/00* (2023.01)

(52) U.S. Cl.
CPC ......... *H10K 50/84* (2023.02); *H10K 50/8423* (2023.02); *H10K 50/8426* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 2014/0355195 A1* | 12/2014 | Kee | G06F 1/1641 361/679.27 |
| 2015/0227172 A1* | 8/2015 | Namkung | H10K 59/40 345/173 |
| 2015/0277029 A1* | 10/2015 | Watanabe | G02B 6/0088 362/606 |
| 2016/0218153 A1 | 7/2016 | Kim | |
| 2016/0349878 A1* | 12/2016 | Kim | G02F 1/133305 |
| 2018/0098442 A1* | 4/2018 | Han | G06F 1/1637 |
| 2019/0104626 A1 | 4/2019 | Jeon | |
| 2019/0107866 A1 | 4/2019 | Han et al. | |

FOREIGN PATENT DOCUMENTS

| | | |
|---|---|---|
| KR | 10-2014-0142004 | 12/2014 |
| KR | 10-2017-0119345 | 10/2017 |
| KR | 10-2018-0034735 | 4/2018 |
| KR | 10-2019-0037585 | 4/2019 |
| KR | 10-2019-0040518 | 4/2019 |

* cited by examiner

*Primary Examiner* — Khaja Ahmad
(74) *Attorney, Agent, or Firm* — H.C. Park & Associates, PLC

(57) ABSTRACT

A display device includes: a display panel; a metal layer disposed on one surface of the display panel and including a first bending portion, and a first flat portion and a second flat portion disposed with the first bending portion interposed therebetween; a first adhesive layer including a first extended portion and a second extended portion disposed along the edge of the first flat portion of the metal layer; and a second adhesive layer disposed along the edge of the second flat portion of the metal layer, wherein the metal layer includes an exposed region in which the first adhesive layer and the second adhesive layer are not disposed, and the exposed region is disposed between the first extended portion and the second extended portion in the first flat portion.

20 Claims, 13 Drawing Sheets

FIG. 13

■ : Adhesion part of adhesive layer    ▦ : Non-adhesion part of adhesive layer

| Item | Ref. | A | B | C | D | E | F |
|---|---|---|---|---|---|---|---|
| Adhesive layer adhesion shape | | | | | | | |
| T1 = 0.1mm Encapsulation layer stain [%] | 0.97 | 0.93 | 0.90 | 0.88 | 0.80 | 0.74 | 0.57 |
| T1 = 0.3mm Encapsulation layer stain [%] | 1.34 | 1.29 | 1.25 | 1.22 | 1.12 | 1.00 | 0.68 |
| Reduction rate of encapsulation layer for Ref. | - | 4 | 7 | 9 | 16 | 25 | 49 |
| Maximum T1 of Encapsulation layer stain | <30μm | <30μm | 45μm | 50μm | 100μm | 145μm | 520μm |

DISPLAY DEVICE

CROSS-REFERENCE TO RELATED APPLICATION

This application claims priority to and the benefit of Korean Patent Application No. 10-2019-0100377 filed on Aug. 16, 2019, which is hereby incorporated by reference for all purposes as if fully set forth herein.

BACKGROUND

Field

Exemplary embodiments/implementations of the invention relate generally to a display device, and, more specifically, to a display device with increased durability.

Discussion of the Background

Recently, flexible display devices capable of being bent have been developed. Such a flexible display device may be used in a folded or curved form and then be utilized in various fields. In the flexible display device, a display element is disposed on a flexible substrate.

As the display element capable of being applied to the flexible display device, there are a light emitting diode (LED), a liquid crystal display (LCD) element, an electrophoretic display (EPD), etc. Among them, the light emitting diode has great flexibility because it may be manufactured in a laminated structure in a form of a thin film, so it has attracted the spotlight as a display element of the flexible display device.

The flexible display devices are classified into a rollable display device that may be rolled like a scroll, a foldable display device that may be folded like paper, a stretchable display device that may be scaled up and down, etc.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device that may reduce or prevent a deformation and failure of the display device by minimizing a stress applied to a display panel by a bracket twist when the display device falls.

Additional features of the inventive concepts will be set forth in the description which follows, and in part will be apparent from the description, or may be learned by practice of the inventive concepts.

A display device according to an exemplary embodiment includes: a display panel; a metal layer disposed on one surface of the display panel and including a first bending portion, and a first flat portion and a second flat portion disposed with the first bending portion interposed therebetween; a first adhesive layer including a first extended portion and a second extended portion disposed along the edge of the first flat portion of the metal layer; and a second adhesive layer disposed along the edge of the second flat portion of the metal layer, wherein the metal layer includes an exposed region in which the first adhesive layer and the second adhesive layer are not disposed, and the exposed region is disposed between the first extended portion and the second extended portion in the first flat portion.

A sum of areas of the first adhesive layer and the second adhesive layer may be 30% or less of a sum of areas of the first flat portion and the second flat portion of the metal layer.

The first flat portion may include a first edge, a second edge, and a third edge, the second flat portion may include a fourth edge, a fifth edge, and a sixth edge, the first adhesive layer may further include a third extended portion, the first extended portion may extend along the first edge of the first flat portion, the second extended portion may extend along the second edge of the first flat portion, the third extended portion may extend along the third edge of the first flat portion, and the second adhesive layer may include a fourth extended portion extending along the fourth edge of the second flat portion, a fifth extended portion extending along the fifth edge of the second flat portion, and a sixth extended portion extending along the sixth edge of the second flat portion.

The first extended portion, the second extended portion, and the third extended portion may be connected, and the fourth extended portion, the fifth extended portion, and the sixth extended portion may be connected.

The width of the first adhesive layer may be 10 mm or less, and the width of the second adhesive layer may be 10 mm or less.

The first extended portion, the second extended portion and the third extended portion may be spaced apart, and the fourth extended portion, the fifth extended portion, and the sixth extended portion may be spaced apart.

The first adhesive layer may include a plurality of third extended portions disposed between the first extended portion and the second extended portion, the first extended portion, the second extended portion, and the plurality of third extended portions may extend in a first direction and be arranged in a second direction crossing the first direction, and the second adhesive layer may include a plurality of fourth extended portions extending in the first direction and arranged in the second direction.

At least one width among the plurality of fourth extended portions may be smaller than a distance between adjacent fourth extended portions among the plurality of fourth extended portions.

The first direction may be perpendicular to a direction in which the bending portion extends.

The first direction may be parallel to a direction in which the bending portion extends.

The first flat portion may include a first edge and a second edge facing each other, the second flat portion may include a third edge and a fourth edge facing each other, the first extended portion of the first adhesive layer may extend along the first edge, the second extended portion of the first adhesive layer may extend along the second edge, and the second adhesive layer may include a third extended portion extending along the third edge and a fourth extended portion extending along the fourth edge.

The exposed region may be disposed along one edge of the first flat portion of the metal layer and one edge of the second flat portion.

The display device according to an exemplary embodiment may further include a bracket adhered to the metal layer by the first adhesive layer and the second adhesive layer.

The bracket may include a first protruded part covering the side of the metal layer.

The display device according to an exemplary embodiment may further include a window disposed on the display panel, and the bracket may further include a second protruded part extending from the first protruded part to cover the edge of the window.

A display device according to an exemplary embodiment includes: a display panel; a metal layer disposed on one surface of the display panel and including a first bending portion, and a first flat portion and a second flat portion disposed with the first bending portion interposed therebetween; and an adhesive layer disposed on at least one edge of the metal layer, wherein an area where the adhesive layer is disposed on the metal layer is 30% or less of a sum of areas of the first flat portion and the second flat portion of the metal layer.

The adhesive layer may include a material with a Young's modulus of 0.1 MPa or less.

The adhesive layer may include an acryl-based resin or a silicon-based resin.

The adhesive layer may include a first adhesive layer disposed at the first flat portion of the metal layer and a second adhesive layer disposed at the second flat portion of the metal layer.

The adhesive layer may deform when the first flat portion and the second flat portion move in opposite directions.

According to exemplary embodiments, it is possible to reduce or prevent the deformation and failure of the display device by minimizing the stress applied to the display panel due to the twisting of the bracket when the display device falls.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 13 a table showing an adhesion shape of an adhesive layer and a display panel strain according to a Young's modulus of an adhesive layer.

DETAILED DESCRIPTION

Figure 1:
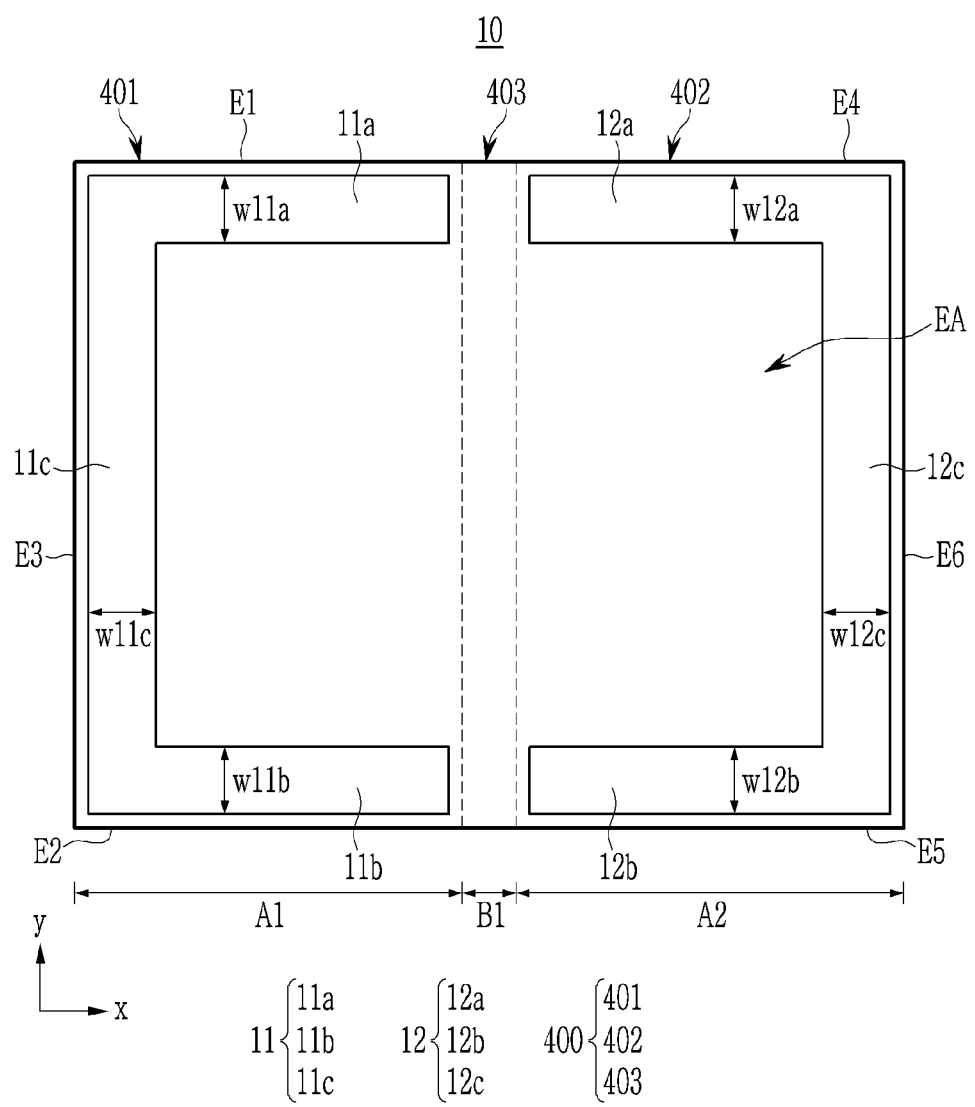
FIG. 1 is a rear view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, throughout the specification, the phrases "on a plane" or "in plan view" means viewing a target portion from the top, and the phrase "on a cross-section" means viewing a cross-section formed by vertically cutting a target portion from the side.

Figure 2:
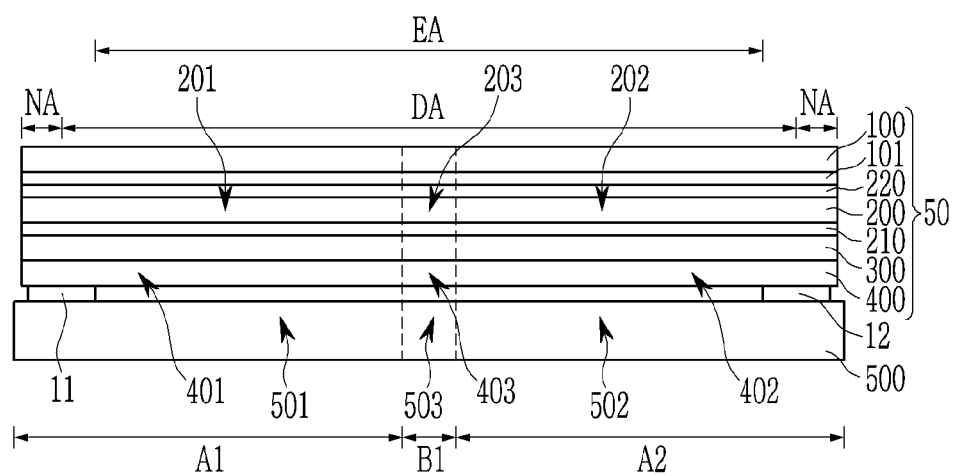
FIG. 2 is a cross-sectional view of a display device according to an exemplary embodiment.

A display device according to an exemplary embodiment is described with reference to FIG. 1 and FIG. 2. FIG. 1 is a rear view of a display device according to an exemplary embodiment, and FIG. 2 is a cross-sectional view of a display device according to an exemplary embodiment. Specifically, FIG. 1 is a rear view of the display device without a bracket.

Referring to FIG. 1, a display device 10 includes a bending region B1 capable of being bent, and a first flat region A1 and a second flat region A2 disposed on respective sides of the bending region B1.

Adhesive layers 11 and 12 for adhering a bracket 500 (referring to FIG. 2) to a metal layer 400 are disposed on the rear of the display device 10. The metal layer 400 includes a first bending portion 403 extending in second direction y and disposed in the bending region B1, and a first flat portion 401 and a second flat portion 402 disposed on respective sides of the first bending portion 403 based on a first direction x crossing the second direction y. The adhesive layers 11 and 12 may be disposed on the edge except for the edge that is in contact with the first bending portion 403 in the first flat portion 401 and the second flat portion 402. The first bending portion 403, the first flat portion 401, and the second flat portion 402 include an exposed region EA where the adhesive layers 11 and 12 are not disposed.

The first adhesive layer 11 is disposed in the first flat portion 401 and the second adhesive layer 12 is disposed in the second flat portion 402.

The first flat portion 401 includes a first edge E1 and a second edge E2 facing each other, and includes a third edge E3 disposed between the first edge E1 and the second edge E2 and facing the first bending portion 403 from an opposite side. The first adhesive layer 11 includes a first extended portion 11a extending along the first edge E1, a second extended portion 11b extending along the second edge E2, and a third extended portion 11c extending along the third edge E3. The first extended portion 11a and the third extended portion 11c of the first adhesive layer 11 are connected, and the second extended portion 11b and the third extended portion 11c are connected. The exposed region EA may be disposed between the first extended portion 11a and the second extended portion 11b, between the second extended portion 11b and the third extended portion 11c, and between the first extended portion 11a and the third extended portion 11c.

A width of the first adhesive layer 11 may be 10 mm or less. That is, the width w11a of the first extended portion 11a, the width w11b of the second extended portion 11b, and the width w11c of the third extended portion 11c of the first adhesive layer 11 may be 10 mm or less. In this case, the width means a width in a direction perpendicular to the direction in which the first extended portion 11a, the second extended portion 11b, and the third extended portion 11c extend on a plane along respective edges.

The second flat portion 402 includes a fourth edge E4 and a fifth edge E5 facing each other from opposite sides, and includes a sixth edge E6 disposed between the fourth edge E4 and the fifth edge E5 and facing the first bending portion 403 from an opposite side. The second adhesive layer 12 includes a fourth extended portion 12a extending along the fourth edge E4, a fifth extended portion 12b extending along the fifth edge E5, and a sixth extended portion 12c extending along the sixth edge E6. The fourth extended portion 12a and the sixth extended portion 12c of the second adhesive layer 12 are connected, and the fifth extended portion 12b and the sixth extended portion 12c are connected. The exposed region EA may be disposed between the fourth extended portion 12a and the fifth extended portion 12b, between the fifth extended portion 12b and the sixth extended portion 12c, and between the fourth extended portion 12a and the sixth extended portion 12c.

The width of the second adhesive layer 12 may be 10 mm or less. That is, the width w12a of the fourth extended portion 12a, the width w12b of the fifth extended portion 12b, and the width w12c of the sixth extended portion 12c of the second adhesive layer 12 may be 10 mm or less. In this case, the width means a width in a direction perpendicular to the direction in which the fourth extended portion 12a, the fifth extended portion 12b, and the sixth extended portion 12c extend on a plane along respective edges.

The adhesive layers 11 and 12 are not disposed on the entire surface of the metal layer 400, and the metal layer 400 includes the exposed region EA of a predetermined area or more in which adhesive layers 21 and 22 are not disposed. A sum of the areas of the first adhesive layer 11 and the second adhesive layer 12 may be 30% or less of the sum of the areas of the first flat portion 401 and the second flat portion 402 of the metal layer 400. Therefore, when the display device 10 falls, deformation of the display panel 200 due to distortion of the bracket 500 may be minimized, and the display device failure due to the deformation of the display panel 200 may be reduced or prevented.

The adhesive layers 11 and 12 may include materials with low modulus of tensile elasticity (Young's modulus). That is, the adhesive layers 11 and 12 may include a material having a Young's modulus of 0.1 MPa (megapascal) or less. The adhesive layers 11 and 12 may include acryl-based resins or silicon-based resins. As the adhesive layers 11 and 12 include the materials with low modulus of tensile elasticity, even if the display device 10 falls and the bracket 500 is twisted, the adhesive layers 11 and 12 are flexibly deformed so that the deformation of the display panel 200 may be minimized.

Referring to FIG. 2, the display device 10 according to an exemplary embodiment includes stacked elements of display device 50, a bracket 500 protecting the stacked elements of display device 50, and adhesive layers 11 and 12 adhering the bracket 500 to the stacked elements of display device 50.

The stacked elements of display device 50 include a metal layer 400, a protection layer 300, a protection film layer 210, a display panel 200, a polarization layer 220, an upper adhesive layer 101, and a window 100.

The metal layer 400 includes a first bending portion 403 that is bendable, and a first flat portion 401 and a second flat portion 402 disposed via the first bending portion 403 interposed therebetween.

The protection layer 300 is disposed on the metal layer 400. The protection layer 300 may have elasticity, and protects the display panel 200 from an external impact of the display device 10. The protection layer 300 may include a polymer and may include, for example, polyurethane foam. The protection layer 300 may overlap the entire surface of the display panel 200.

The protection film layer 210 is disposed on the protection layer 300, and the display panel 200 is disposed on the protection film layer 210.

The protection film layer 210 may be disposed under the display panel 200 to protect the display panel 200. The protection film layer 210 may be a polyimide film.

The display panel 200 includes a display area DA for displaying an image and a non-display area NA of a peripheral area thereof. The display panel 200 may include a flexible substrate such as a plastic film, an organic light emitting diode, and a pixel circuit. The organic light emitting diode and the pixel circuit may be disposed on the flexible substrate to display the image on the display area DA. The pixel circuit may include a plurality of transistors, and the organic light emitting diode may include a pixel electrode connected to at least one transistor, a common electrode transmitting a common voltage, and an emission layer disposed between the pixel electrode and the common electrode. In addition, the display panel 200 may further include an encapsulation layer covering the organic light emitting diode.

The display panel 200 includes a second bending portion 203 disposed in the bending region B1, and a third flat portion 201 and a fourth flat portion 202 disposed via the second bending portion 203 interposed therebetween. The second bending portion 203 of the display panel 200 may also be disposed in the display area DA to display the image in the region that is bent.

A polarization layer 220 is disposed on the display panel 200. The polarization layer 220 may only transmit light that is polarized in one direction.

An upper adhesive layer 101 is disposed on the polarization layer 220, and a window 100 is disposed on the upper adhesive layer 101. The window 100 is transparent so that the image displayed on the display panel 200 may be seen by the user. The upper adhesive layer 101 may be disposed between the polarization layer 220 and the window 100 to attach the window 100 to the polarization layer 220.

The bracket 500 and the adhesive layers 11 and 12 adhering the bracket 500 to the metal layer 400 are disposed under the metal layer 400. Also, the exposed region EA in which the adhesive layers 11 and 12 are not formed is disposed on the rear of the metal layer 400. The exposed region EA may be disposed in the first bending portion 403 and a partial region of the first flat portion 401 and the second flat portion 402. The exposed region EA may overlap at least part of the display area DA.

The bracket 500 includes a third bending portion 503 disposed in the bending region B1, and a fifth flat portion 501 and a sixth flat portion 502 disposed via the third bending portion 503 interposed therebetween.

The third bending portion 503 of the bracket 500 may be connected to the fifth flat portion 501 and the sixth flat portion 502 by a hinge or the like to be bendable. However, the present disclosure is not limited thereto, and the bracket 500 may include any configuration that allows the third bending portion 503 to be bent.

Figure 3:
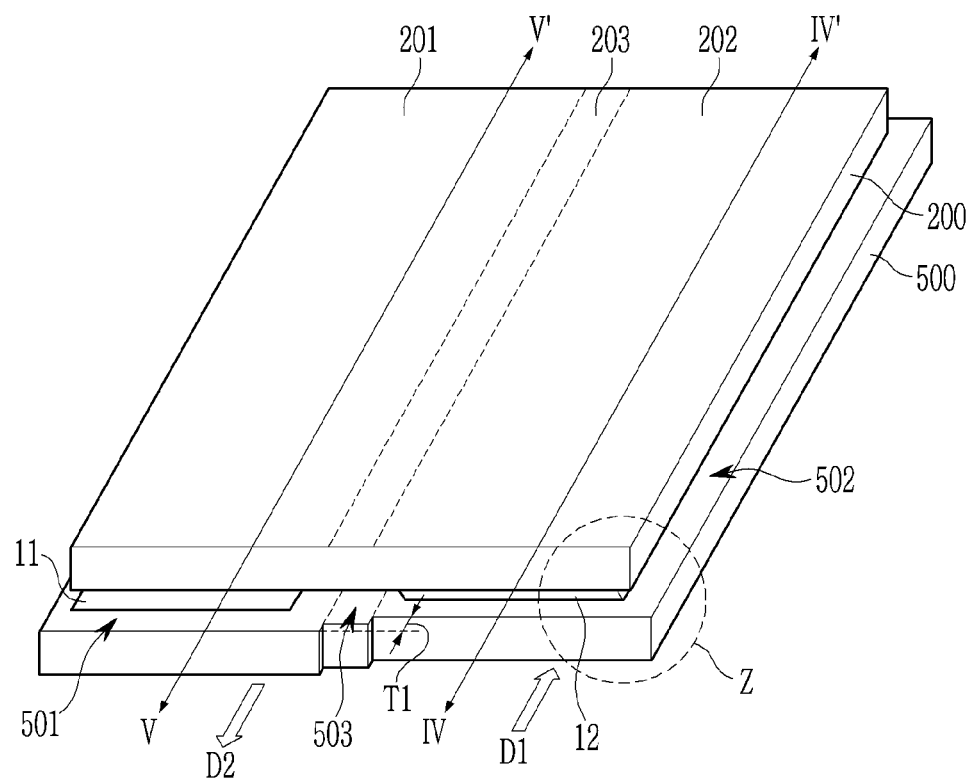
FIG. 3 is a perspective view of a display device according to an exemplary embodiment after a fall.
Figure 4:
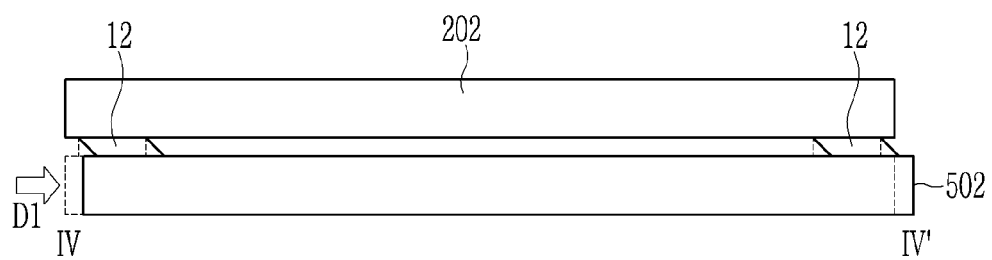
FIG. 4 is a cross-sectional view taken along a line IV-IV' of FIG. 3.
Figure 5:
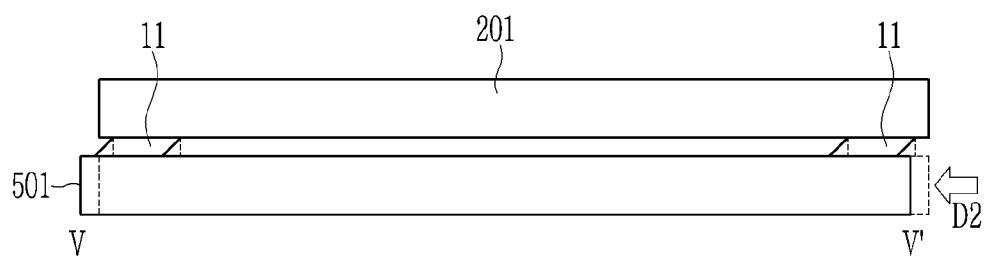
FIG. 5 is a cross-sectional view taken along a line V-V' of FIG. 3.

Hereinafter, the display device during a fall or similar impact of the display device according to an exemplary embodiment is described with reference to FIG. 3, FIG. 4, and FIG. 5. FIG. 3 is a perspective view of a display device according to an exemplary embodiment after a fall. FIG. 4 is a cross-sectional view taken along a line IV-IV' of FIG. 3, and FIG. 5 is a cross-sectional view taken along a line V-V' of FIG. 3. FIG. 3, FIG. 4, and FIG. 5 briefly show only the display panel 200, the adhesive layers 11 and 12, and the bracket 500.

If the display device falls and one corner Z collides with the ground or an object, the sixth flat portion 502 of the bracket 500 moves under the force of the third direction D1. At this time, the fifth flat portion 501 of the bracket 500 moves in the fourth direction D2 opposite to the third direction D1 by inertia to maintain the drop motion. The fifth flat portion 501 and the sixth flat portion 502 of the bracket 500 move in the opposite directions to each other and are deviated by a predetermined distance T1 (hereinafter, referred to as 'a deviation distance').

In a case of a comparative example including the adhesive layer disposed on the entire surface of the rear of the metal layer 400, the display panel 200 moves along with the bracket 500. As a result, the third flat portion 201 and the fourth flat portion 202 of the display panel 200 are forced in the opposite directions D1 and D2, so that a crack occurs in the second bending portion 203 of the display panel 200 or a region adjacent thereto.

However, in the case of the display device according to an exemplary embodiment of the inventive concepts, an adhesion area of the adhesive layers 11 and 12 may be minimized, as the adhesive layers 11 and 12 include the material having a low Young's modulus, when the display device falls, the adhesive layers 11 and 12 are smoothly deformed, thereby minimizing the deformation of the display panel 200.

Specifically, referring to FIG. 4, when the sixth flat portion 502 of the bracket 500 moves in the third direction D1, the shape of the second adhesive layer 12 is deformed, so that the fourth flat portion 202 of the display panel 200 may not move.

Also, referring to FIG. 5, when the fifth flat portion 501 of the bracket 500 moves in the fourth direction D2, the shape of the first adhesive layer 11 may be deformed and the third flat portion 201 of the display panel 200 may not move.

Figure 6:
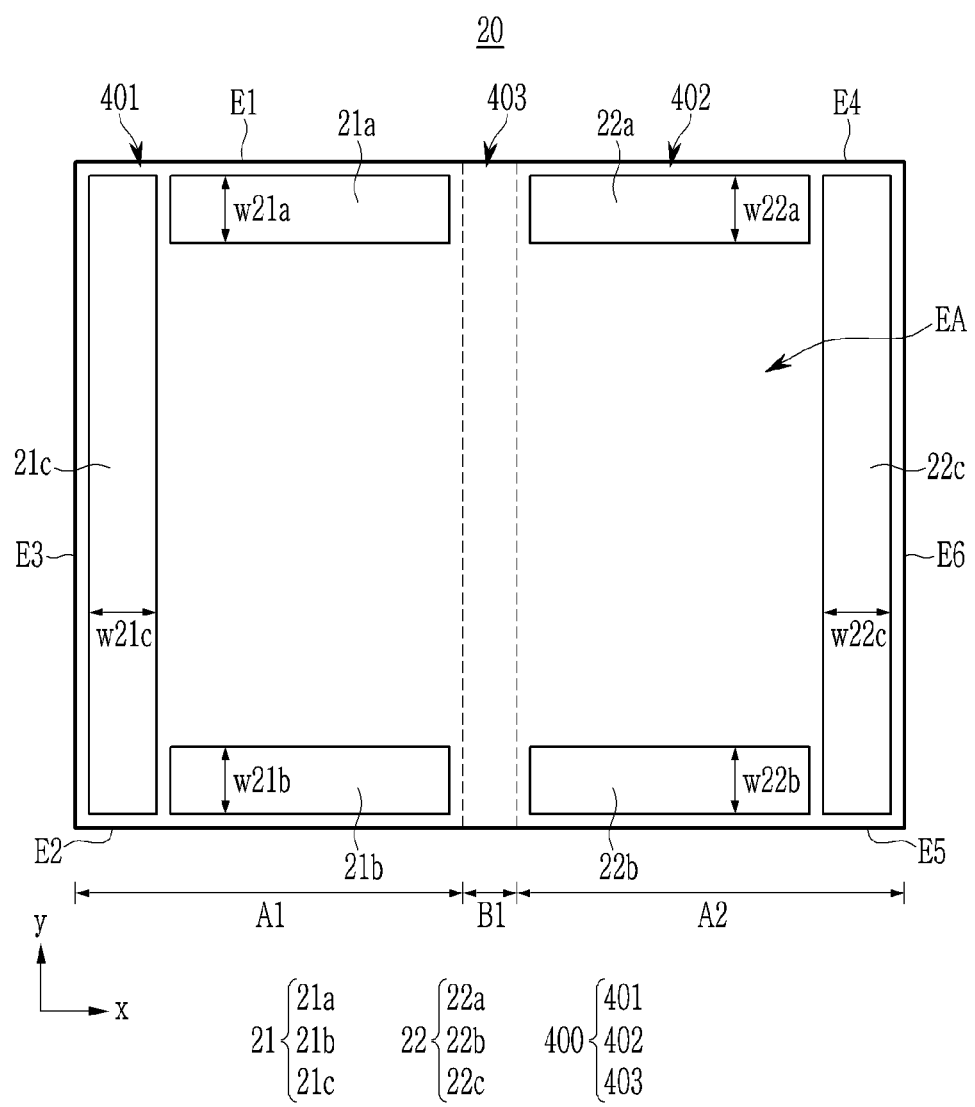
FIG. 6 is a rear view of a display device according to an exemplary embodiment.

Hereinafter, a display device 20 according to an exemplary embodiment is described with reference to FIG. 6. FIG. 6 is a rear view of a display device according to an exemplary embodiment. Specifically, FIG. 6 is a rear view of the display device without the bracket. Except for adhesive layers 21 and 22, since it is similar to FIG. 1, the overlapped description is omitted.

The display device 20 according to an exemplary embodiment includes the metal layer 400, and the metal layer 400 includes the first bending portion 403 extending in the second direction y and disposed in the bending region B1, and the first flat portion 401 and the second flat portion 402 disposed on respective sides of the first bending portion 403 based on the first direction x crossing the second direction y.

The adhesive layers 21 and 22 are disposed for attaching the bracket 500 to the metal layer 400 are disposed on the rear of the display device 20. The first adhesive layer 21 is disposed in the first flat portion 401 of the metal layer 400 and the second adhesive layer 22 is disposed in the second flat portion 402.

The first adhesive layer 21 includes a first extended portion 21a extending along the first edge E1, a second extended portion 21b extending along the second edge E2, and a third extended portion 21c extending along the third edge E3. The first extended portion 21a, the second extended portion 21b, and the third extended portion 21c of the first adhesive layer 21 in this embodiment are separated from each other. The exposed region EA may be disposed between the first extended portion 21a and the second extended portion 21b, between the second extended portion 21b and the third extended portion 21c, and between the first extended portion 21a and the third extended portion 21c.

The width of the first adhesive layer 21 may be 10 mm or less. That is, the width w21a of the first extended portion 21a, the width w21b of the second extended portion 21b, and the width w21c of the third extended portion 21c of the first adhesive layer 21 may be 10 mm or less. In this case, the width means a width in a direction perpendicular to the direction in which the first extended portion 21a, the second extended portion 21b, and the third extended portion 21c extend on a plane along respective edges.

The second adhesive layer 22 includes a fourth extended portion 22a extending along the fourth edge E4, a fifth extended portion 22b extending along the fifth edge E5, and a sixth extended portion 22c extending along the sixth edge E6. The fourth extended portion 22a, the fifth extended portion 22b, and the sixth extended portion 22c of the second adhesive layer 22 in this embodiment are separated. The exposed region EA may be disposed between the fourth extended portion 22a and the fifth extended portion 22b, between the fifth extended portion 22b and the sixth extended portion 22c, and between the fourth extended portion 22a and the sixth extended portion 22c.

The width of the second adhesive layer 22 may be 10 mm or less. That is, the width w22a of the fourth extended portion 22a, the width w22b of the fifth extended portion 22b, and the width w22c of the sixth extended portion 22c of the second adhesive layer 22 may be 10 mm or less. In this case, the width means a width in a direction perpendicular to the direction in which the fourth extended portion 22a, the fifth extended portion 22b, and the sixth extended portion 22c extend on a plane along respective edges.

The adhesive layers 21 and 22 are not disposed in the entire surface of the metal layer 400, and the metal layer 400 includes the exposed region EA where the adhesive layers 21 and 22 are not disposed. The sum of the areas of the first adhesive layer 21 and the second adhesive layer 22 may be 30% or less of the sum of the areas of the first flat portion 401 and the second flat portion 402 of the metal layer 400.

The adhesive layers 21 and 22 may include a low Young's modulus material. For example, the adhesive layers 21 and 22 may include materials with a Young's modulus of 0.1 MPa or less. The adhesive layers 21 and 22 may include acryl-based resins or silicon-based resins.

Figure 7:
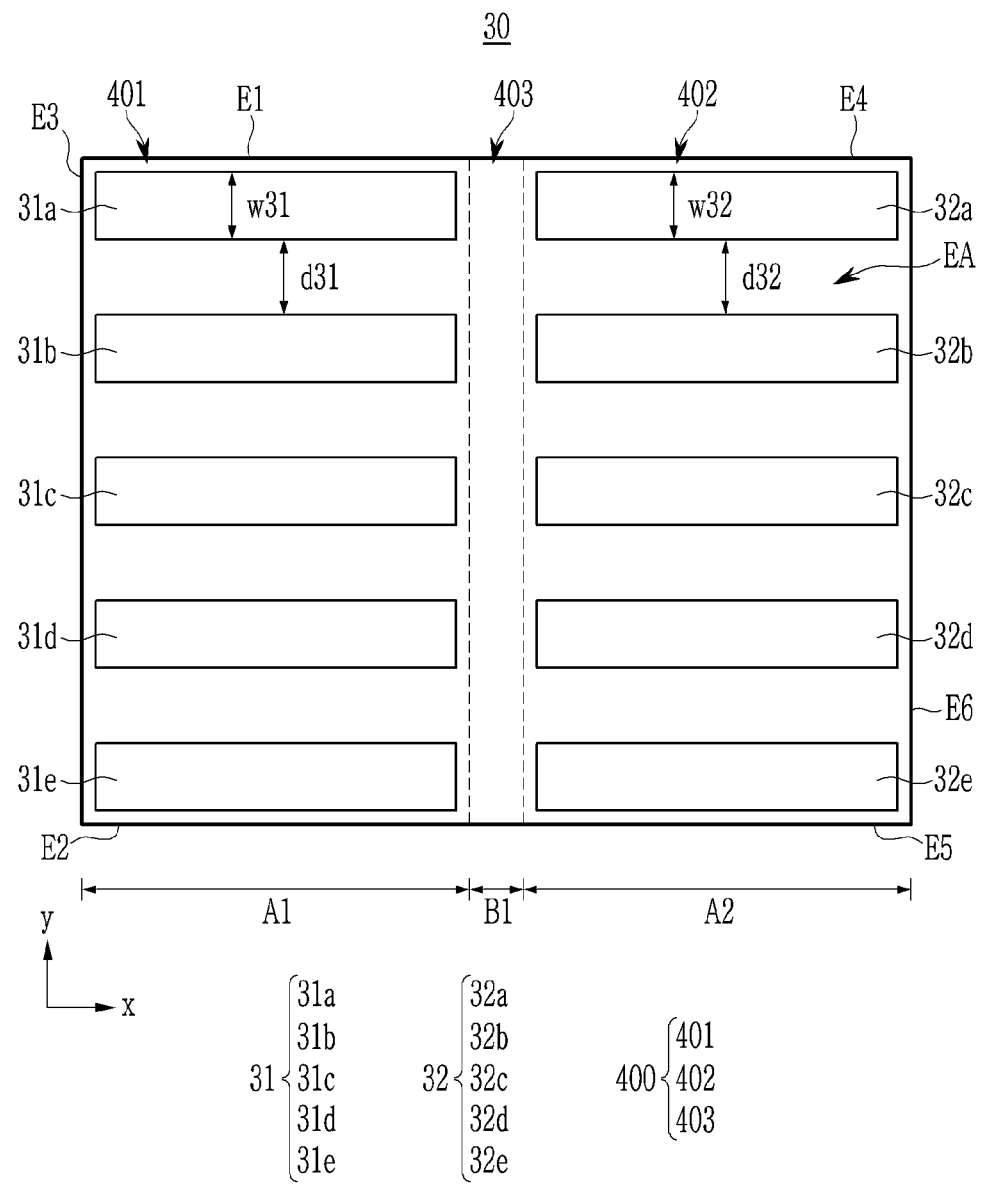
FIG. 7 is a rear view of a display device according to an exemplary embodiment.

Hereinafter, a display device 30 according to an exemplary embodiment is described with reference to FIG. 7. FIG. 7 is a rear view of a display device according to an exemplary embodiment. Specifically, FIG. 7 is a rear view of the display device without the bracket. Except for the adhesive layers 31 and 32, since it is similar to FIG. 1, redundant description is omitted.

On the rear of the display device 30 according to an exemplary embodiment, adhesive layers 31 and 32 are disposed for adhering the bracket to the metal layer 400. The first adhesive layer 31 is disposed in the first flat portion 401 of the metal layer 400, and the second adhesive layer 32 is disposed in the second flat portion 402.

The first adhesive layer 31 includes a plurality of first extended portions 31a, 31b, 31c, 31d, and 31e extending in the first direction x and arranged in the second direction y. The plurality of first extended portions 31a, 31b, 31c, 31d and 31e include extended portions 31a and 31e disposed along the facing first edge E1 and second edge E2, and extended portions 31b, 31c, and 31d disposed between the extended portions 31a and 31e disposed along the edge. The plurality of first extended portions 31a, 31b, 31c, 31d, and 31e are separated from each other, and the exposed region EA is disposed between the plurality of first extended portions 31a, 31b, 31c, 31d, and 31e.

The width w31 of the first extended portions 31a, 31b, 31c, 31d, and 31e may be 10 mm or less. However, the width w31 of the first extended portions 31a, 31b, 31c, 31d, and 31e is not limited thereto. The width w31 of the first extended portions 31a, 31b, 31c, 31d, and 31e may be smaller than the distance d31 between the adjacent first extended portions 31a, 31b, 31c, 31d, and 31e. In FIG. 7, the first adhesive layer 31 includes five first extended portions 31a, 31b, 31c, 31d, and 31e, however the number of first extended portions 31a, 31b, 31c, 31d, and 31e is not limited thereto.

The second adhesive layer 32 includes a plurality of second extended portions 32a, 32b, 32c, 32d, and 32e extending in the first direction x and arranged in the second direction y. The plurality of second extended portions 32a, 32b, 32c, 32d, and 32e may include extended portions 32a and 32e disposed along the facing fourth edge E4 and fifth edge E5, and extended portions 32b, 32c, and 32d disposed between the extended portions 32a and 32e disposed along the edge. The plurality of second extended portions 32a, 32b, 32c, 32d, and 32e are separated from each other, and the exposed region EA is disposed between the plurality of second extended portions 32a, 32b, 32c, 32d, and 32e.

The width w32 of the second extended portions 32a, 32b, 32c, 32d, and 32e may be 10 mm or less. However, the width w32 of the second extended portions 32a, 32b, 32c, 32d, and 32e is not limited thereto. The width w32 of the second extended portions 32a, 32b, 32c, 32d, and 32e may be less than the distance d32 between the adjacent second extended portions 32a, 32b, 32c, 32d, and 32e. FIG. 7 shows that the second adhesive layer 32 includes five second extended portions 32a, 32b, 32c, 32d, and 32e, but the number of second extended portions 32a, 32b, 32c, 32d, and 32e is not limited thereto.

The width w32 of the second extended portions 32a, 32b, 32c, 32d, and 32e may be equal to the width w31 of the first extended portions 31a, 31b, 31c, 31d, and 31e. However, the present invention is not limited thereto, and the width w32 of the second extended portions 32a, 32b, 32c, 32d, and 32e may be different from the width w31 of the first extended portions 31a, 31b, 31c, 31d, and 31e.

The sum of the areas of the first adhesive layer 31 and the second adhesive layer 32 may be 30% or less of the sum of the areas of the first flat portion 401 and the second flat portion 402 of the metal layer 400. The adhesive layers 31 and 32 may include low Young's modulus materials. For example, the adhesive layers 31 and 32 may include materials with a Young's modulus of 0.1 MPa or less. The adhesive layers 31 and 32 may include acryl-based resins or silicon-based resins.

Figure 8:
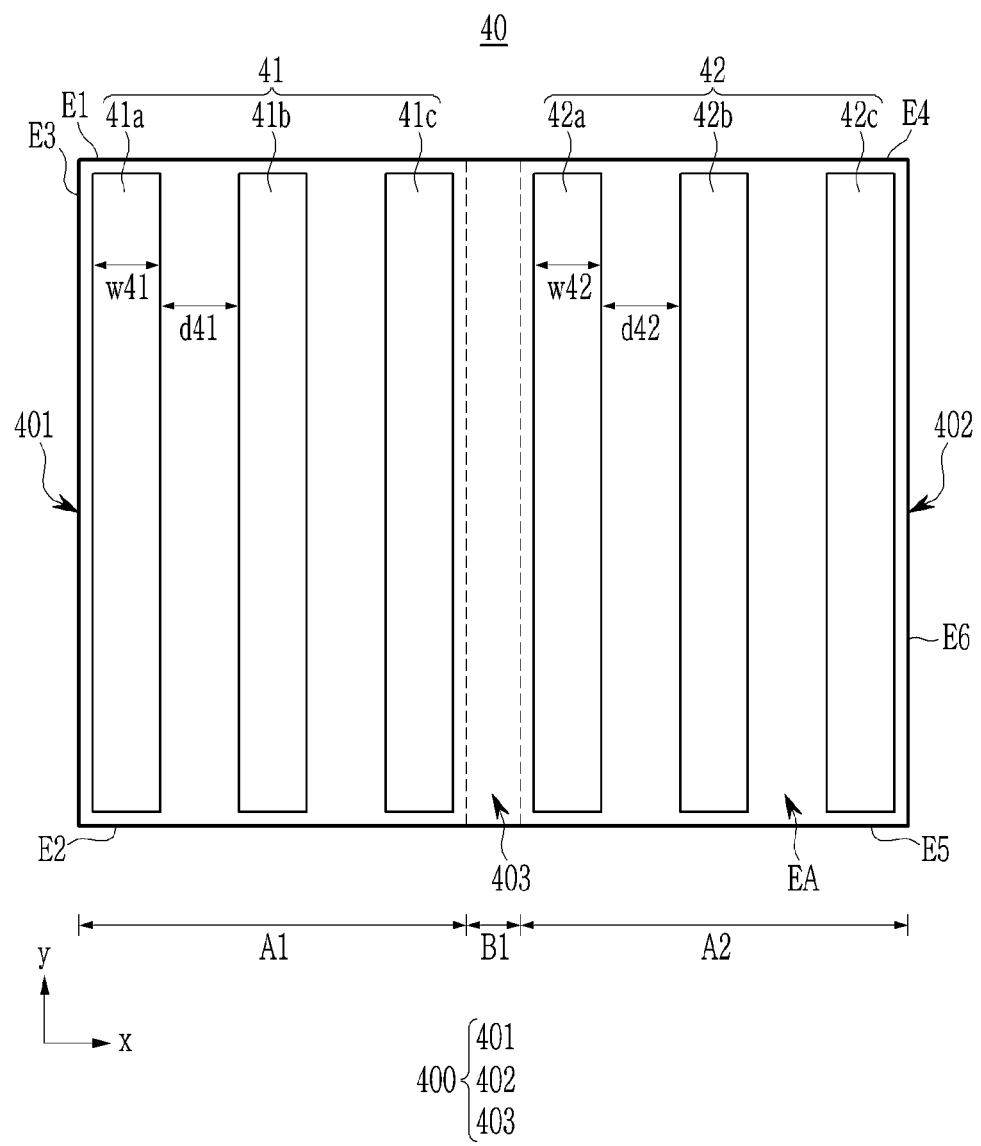
FIG. 8 is a rear view of a display device according to an exemplary embodiment.

Hereinafter, a display device 40 according to an exemplary embodiment is described with reference to FIG. 8. FIG. 8 is a rear view of a display device according to an exemplary embodiment. Specifically, FIG. 8 is a rear view of the display device without the bracket. Except for the adhesive layers 41 and 42, since it is similar to FIG. 1, the redundant description is omitted.

On the rear of the display device 40 according to an exemplary embodiment, the adhesive layers 41 and 42 are disposed for attaching the bracket to the metal layer 400. The first adhesive layer 41 is disposed in the first flat portion 401 of the metal layer 400, and the second adhesive layer 42 is disposed in the second flat portion 402.

The first adhesive layer 41 includes a plurality of first extended portions 41a, 41b, and 41c extending in the second direction y and arranged in the first direction x. The plurality of first extended portions 41a, 41b, and 41c may include extended portions 41a and 41c disposed along the third edge E3 and the edge in contact with the first bending portion 403, and at least one extended portion 41b disposed between the extended portions 41a and 41c disposed along the edge. The plurality of first extended portions 41a, 41b, and 41c are separated from each other, and the exposed region EA is disposed between the plurality of first extended portions 41a, 41b, and 41c.

The width w41 of the first extended portions 41a, 41b, and 41c may be 10 mm or less. However, the width w41 of the first extended portions 41a, 41b, and 41c is not limited thereto. The width w41 of the first extended portions 41a, 41b, and 41c may be less than the distance d41 between the adjacent first extended portions 41a, 41b, and 41c. Although the first adhesive layer 41 includes three first extended portions 41a, 41b, and 41c in FIG. 8, the number of first extended portions 41a, 41b, and 41c is not limited thereto.

The second adhesive layer 42 includes a plurality of second extended portions 42a, 42b, and 42c extending in the second direction y and arranged in the first direction x. The plurality of second extended portions 42a, 42b, and 42c include extended portions 42a and 42c disposed along the sixth edge E6 and the edge in contact with the first bending portion 403, and include at least one extended portion 42b disposed between the extended portions 42a and 42c disposed along the edge. The plurality of second extended portions 42a, 42b, and 42c are spaced apart from each other, and the exposed region EA is disposed between the plurality of second extended portions 42a, 42b, and 42c.

The width w42 of the second extended portions 42a, 42b, and 42c may be 10 mm or less. However, the width w42 of the second extended portions 42a, 42b, and 42c is not limited thereto. The width w42 of the second extended portions 42a, 42b, and 42c may be less than the distance d42 between the adjacent second extended portions 42a, 42b, and 42c. FIG. 8 shows that the second adhesive layer 42 includes three second extended portions 42a, 42b, and 42c, however the number of second extended portions 42a, 42b, and 42c is not limited thereto.

The width w42 of the second extended portions 42a, 42b, and 42c may be equal to the width w41 of the first extended portions 41a, 41b, and 41c. However, the present invention is not limited thereto, and the width w42 of the second extended portions 42a, 42b, and 42c may be different from the width w41 of the first extended portions 41a, 41b, and 41c.

The sum of the areas of the first adhesive layer 41 and the second adhesive layer 42 may be 30% or less of the sum of the areas of the first flat portion 401 and the second flat portion 402 of the metal layer 400. The adhesive layers 41 and 42 may include low Young's modulus materials. For example, the adhesive layers 41 and 42 may include materials with a Young's modulus of 0.1 MPa or less. The adhesive layers 41 and 42 may comprise acryl-based resins or silicon-based resins.

Figure 9:
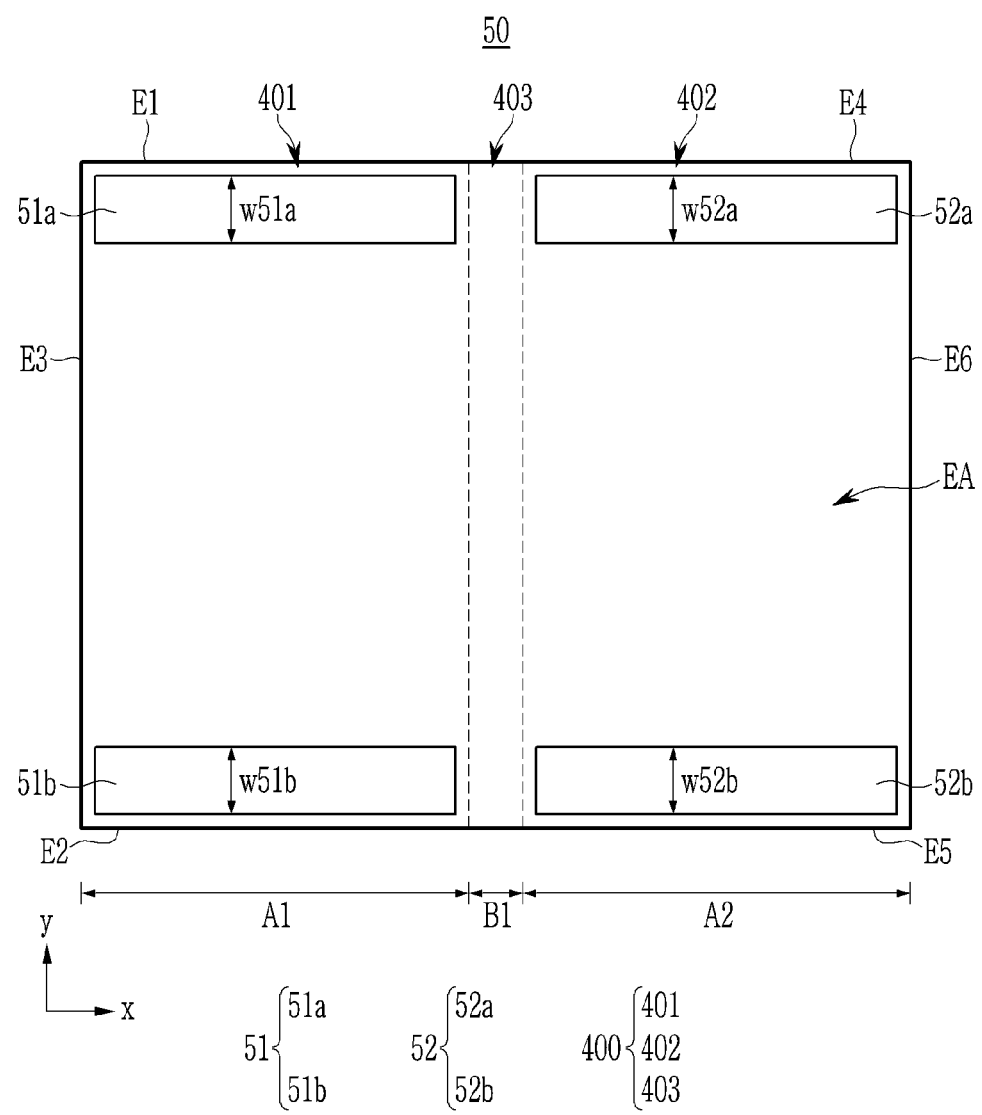
FIG. 9 is a rear view of a display device according to an exemplary embodiment.

Hereinafter, a display device 50 according to an exemplary embodiment is described with reference to FIG. 9. FIG. 9 is a rear view of a display device according to an exemplary embodiment. Specifically, FIG. 9 is a rear view of the display device without the bracket. Except for adhesive layers 51 and 52, since it is similar to FIG. 1, the redundant description is omitted.

On the rear of the display device 50 according to an exemplary embodiment, the adhesive layers 51 and 52 are disposed for attaching the bracket to the metal layer 400. The first adhesive layer 51 is disposed in the first flat portion 401 of the metal layer 400, and the second adhesive layer 52 is disposed in the second flat portion 402.

The first adhesive layer 51 includes a first extended portion 51a extending along the first edge E1, and a second extended portion 51b extending along the second edge E2. The exposed region EA in which the adhesive layers 51 and 52 are not formed is disposed between the first extended portion 51a and the second extended portion 51b.

The width of the first adhesive layers 51 may be 10 mm or less. That is, the width w51a of the first extended portion 51a of the first adhesive layer 51 and the width w51b of the second extended portion 51b may be 10 mm or less.

The second adhesive layer 52 includes a third extended portion 52a extending along the fourth edge E4 and a fourth extended portion 52b extending along the fifth edge E5. The exposed region EA in which the adhesive layers 51 and 52 are not formed is disposed between the third extended portion 52a and the fourth extended portion 52b.

The width of the second adhesive layer 52 may be 10 mm or less. That is, the width w52a of the third extended portion 52a of the second adhesive layer 52 and the width w52b of the fourth extended portion 52b may be 10 mm or less.

The sum of the areas of the first adhesive layer 51 and the second adhesive layer 52 may be 30% or less of the sum of the areas of the first flat portion 401 and the second flat portion 402 of the metal layer 400. The adhesive layers 51 and 52 may include low Young's modulus materials. For example, the adhesive layers 51 and 52 may include materials with a Young's modulus of 0.1 MPa or less. The adhesive layers 51 and 52 may include acryl-based resins or silicon-based resins.

Figure 10:
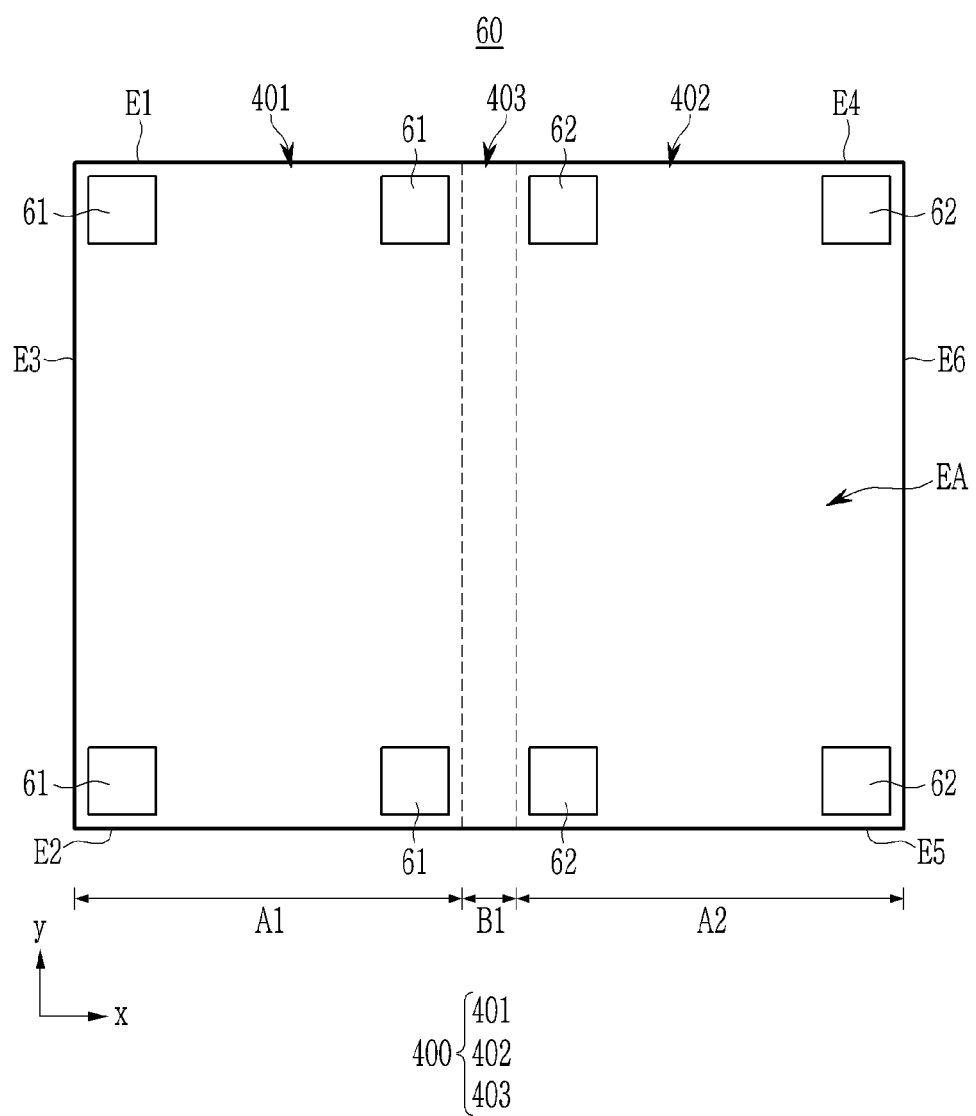
FIG. 10 is a rear view of a display device according to an exemplary embodiment.

Hereinafter, the display device 60 according to an exemplary embodiment is described with reference to FIG. 10. FIG. 10 is a rear view of a display device according to an exemplary embodiment. Specifically, FIG. 10 is a rear view of the display device without the bracket. Except for adhesive layers 61 and 22, since it is similar to FIG. 1, the redundant description is omitted.

On the rear of a display device 60 according to an exemplary embodiment, the adhesive layers 61 and 62 are disposed for adhering the bracket 500 to the metal layer 400. The first adhesive layer 61 is disposed in the first flat portion 401 of the metal layer 400, and the second adhesive layer 62 is disposed in the second flat portion 402.

The first adhesive layer 61 is disposed to be spaced apart in the corners of the first flat portion 401, and the second adhesive layer 62 is disposed to be spaced apart in the corners of the second flat portion 402.

In other words, the first adhesive layer 61 may be disposed between the first edge E1 and the third edge E3, between the third edge E3 and the second edge E2, between the second edge E2 and the first bending portion 403, and between the first edge E1 and the first bending portion 403. Also, the second adhesive layer 62 may be disposed between the fourth edge E4 and the sixth edge E6, between the sixth edge E6 and the fifth edge E5, between the fifth edge E5 and the first bending portion 403, and between the fourth edge E4 and the first bending portion 403. The exposed region EA in which the first adhesive layer 61 and the second adhesive layer 62 are not formed is disposed along the first edge E1, the second edge E2, the third edge E3, the fourth edge E4, the fifth edge E5, and the sixth edge E6. Also, the exposed region EA is also disposed on the edge of the first flat portion 401 adjacent to the first bending portion 403 and the edge of the second flat portion 402 adjacent to the first bending portion 403.

The sum of the areas of the first adhesive layer 61 and the second adhesive layer 62 may be 30% or less of the sum of the areas of the first flat portion 401 and the second flat portion 402 of the metal layer 400. The adhesive layers 61 and 62 may include low Young's modulus materials. For example, the adhesive layers 61 and 62 may include materials with a Young's modulus of 0.1 MPa or less. The adhesive layers 61 and 62 may include acryl-based resins or silicon-based resins.

Figure 11:
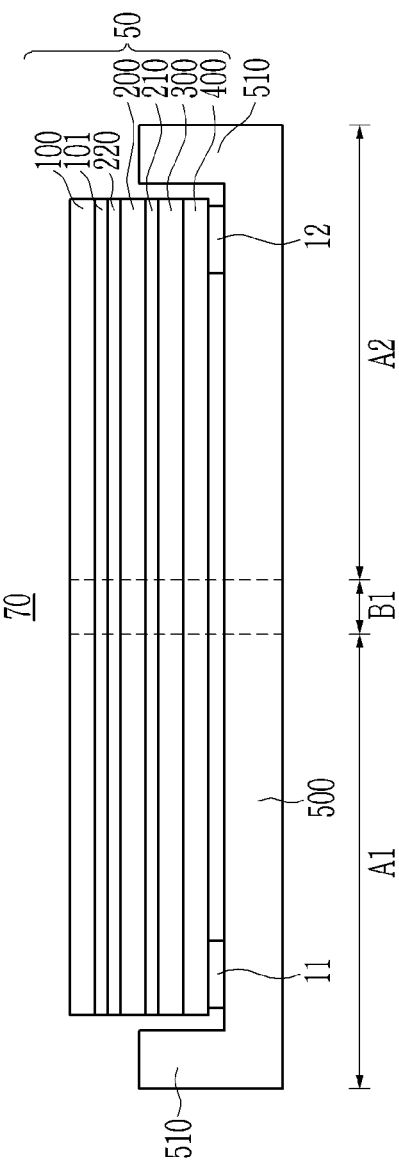
FIG. 11 is a cross-sectional view of a display device according to an exemplary embodiment.

Hereinafter, the display device according to an exemplary embodiment is described with reference to FIG. 11. FIG. 11 is a cross-sectional view of a display device 70 according to an exemplary embodiment. The display device of FIG. 11 is the same as the display device of FIG. 2 except for the bracket 500, so the description of the overlapping configurations is omitted.

The display device according to an exemplary embodiment includes a bracket 500 adhered to the metal layer 400 by the adhesive layers 11 and 12. The bracket 500 includes a first protruded part 510 covering the side of the metal layer 400. The bracket 500 is also disposed on the back and side of the metal layer 400, thereby easily protecting the display device 70.

In FIG. 11, the adhesive layers 11 and 12 may have the shape of the adhesive layer shown in one among FIG. 1 and FIG. 6 to FIG. 10.

Figure 12:
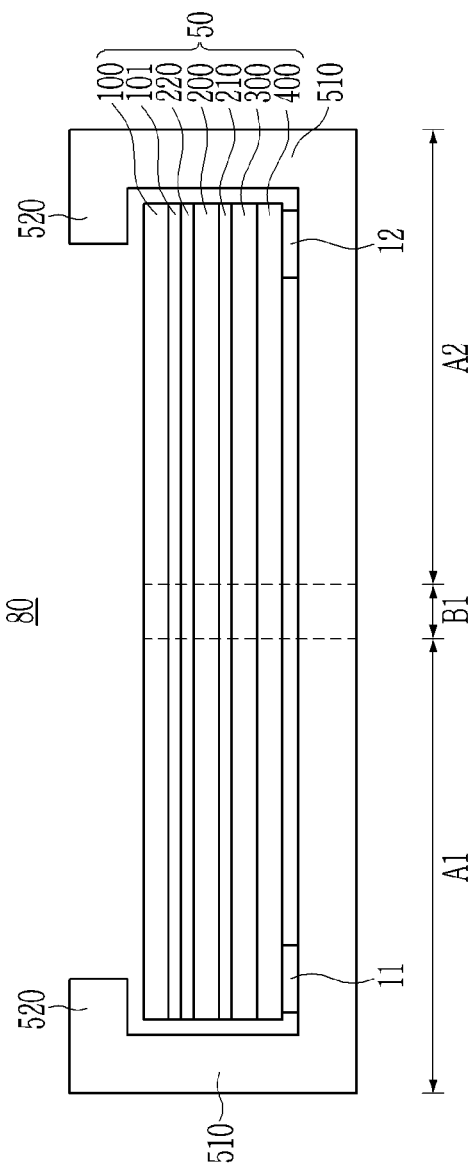
FIG. 12 is a cross-sectional view of a display device according to an exemplary embodiment.

Hereinafter, a display device according to an exemplary embodiment is described with reference to FIG. 12. FIG. 12 is a cross-sectional view of a display device 80 according to an exemplary embodiment. The display device 80 of FIG. 12 is the same as the display device of FIG. 2 so that the description of the overlapping configurations is omitted.

The display device 80 according to an exemplary embodiment includes the bracket 500 adhered to the metal layer 400 by the adhesive layers 11 and 12. The bracket 500 includes a first protruded part 510 covering the side of the metal layer 400, and a second protruded part 520 extending from the first protruded part 510 to cover the edge of the window 100. The bracket 500 covers the side of the stacked elements of display device 50 and the edge of the window 100 to easily protect the display device.

The adhesive layers 11 and 12 of FIG. 12 may have the shape of the adhesive layers of one among FIG. 1 and FIG. 6 to FIG. 10.

FIG. 13 a table showing an adhesion shape of an adhesive layer and a display panel strain according to a modulus of an adhesive layer.

A comparative example "Ref" is a case in which the adhesive layer with a Young's modulus of 0.2 MPa is disposed on the entire surface of the first flat portion and the second flat portion of the metal layer, and "A" is a case in which the adhesive layer with a Young's modulus of 0.05 MPa is disposed on the entire surface of the first flat portion and the second flat portion of the metal layer. Also, "B" is the exemplary embodiment of FIG. 8, "C" is the exemplary embodiment of FIG. 7, "D" is the exemplary embodiment of FIG. 1, E is the exemplary embodiment of FIG. 9, and "F" is the exemplary embodiment of FIG. 10. Particularly, in "D", the area of the adhesive layer is 20% of the sum of the areas of the first flat portion and the second flat portion of the metal layer.

Referring to FIG. 3 and FIG. 13, when the fifth flat portion 501 and the sixth flat portion 502 of the bracket 500 move in opposite directions and the deviation distance T1 is 0.1 mm or 0.3 mm, it may be confirmed that the strain of the encapsulation layer of the display panel 200 is lower in "A" compared with "Ref", and in the cases of "B", "C", "D", "E", and "F" in which the adhesive layer is not disposed on the entire surface, the strain of the encapsulation layer is lower than "Ref." and "A". In this case, the strain of the encapsulation layer means the strain per unit length of the encapsulation layer.

Also, in the strain of 0.8% of the encapsulation layer, the maximum deviation distance T1 of the bracket is less than 30 μm for "Ref" and "A", however it may be confirmed that the maximum deviation distance T1 is large compared with "Ref." and "A" for the cases of "B", "C", "D", "E", "F". That is, in the cases of "B", "C", "D", "E", and "F", the deformation of the display panel may be minimized even if the deviation distance T1 is large.

Some of the advantages that may be achieved by exemplary implementations/embodiments of the invention include prevention or reduction of the deformation and failure of the display device by minimizing the stress applied to the display panel due to the twisting of the bracket when the display device falls.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel;
a metal layer disposed on one surface of the display panel and including a first bending portion, and a first flat portion and a second flat portion disposed with the first bending portion interposed therebetween;
a first adhesive layer including a first extended portion, a second extended portion, and a third extended portion disposed along a first edge, a second edge, and a third edge of the first flat portion of the metal layer, respectively, the first to third extended portions defining an interior opening, and
a second adhesive layer disposed along an edge of the second flat portion of the metal layer, ends of the first extended portion and the second extended portion that are not connected to the third extended portion being spaced apart from the second adhesive layer,
wherein the metal layer includes an exposed region in which the first adhesive layer and the second adhesive layer are not disposed, and
the exposed region is disposed in the interior opening between the first extended portion and the third extended portion, the second extended portion and the third extended portion, and the first extended portion and the second extended portion in the first flat portion.

2. The display device of claim 1, wherein:
a sum of areas of the first adhesive layer and the second adhesive layer is 30% or less of a sum of areas of the first flat portion and the second flat portion of the metal layer.

3. The display device of claim 1, wherein:
the second flat portion includes a fourth edge, a fifth edge, and a sixth edge,
the second adhesive layer includes:
a fourth extended portion extending along the fourth edge of the second flat portion,
a fifth extended portion extending along the fifth edge of the second flat portion, and
a sixth extended portion extending along the sixth edge of the second flat portion.

4. The display device of claim 3, wherein:
the fourth extended portion, the fifth extended portion, and the sixth extended portion are connected.

5. The display device of claim 4, wherein:
a width of the first adhesive layer is 10 mm or less in plan view, and a width of the second adhesive layer is 10 mm or less in plan view.

6. The display device of claim 3, wherein:
the first extended portion, the second extended portion, and the third extended portion are spaced apart, and
the fourth extended portion, the fifth extended portion, and the sixth extended portion are spaced apart.

7. The display device of claim 1, wherein:
the first adhesive layer includes a plurality of third extended portions disposed between the first extended portion and the second extended portion;
the first extended portion, the second extended portion, and the plurality of third extended portions extend in a first direction and are arranged in a second direction crossing the first direction; and
the second adhesive layer includes a plurality of fourth extended portions extending in the first direction and arranged in the second direction.

8. The display device of claim 7, wherein:
at least one width among the plurality of fourth extended portions is smaller than a distance between adjacent fourth extended portions among the plurality of fourth extended portions.

9. The display device of claim 7, wherein:
the first direction is perpendicular to a direction in which the bending portion extends.

10. The display device of claim 1, wherein:
the first flat portion includes a first edge and a second edge facing each other;
the second flat portion includes a third edge and a fourth edge facing each other;
the first extended portion of the first adhesive layer extends along the first edge;
the second extended portion of the first adhesive layer extends along the second edge; and
the second adhesive layer includes a third extended portion extending along the third edge and a fourth extended portion extending along the fourth edge.

11. The display device of claim 1, wherein:
the exposed region is disposed along one edge of the first flat portion of the metal layer and one edge of the second flat portion.

12. The display device of claim 3, further comprising:
a bracket adhered to the metal layer by the first adhesive layer and the second adhesive layer.

13. The display device of claim 12, wherein:
the bracket includes a first protruded part covering a side of the metal layer.

14. A display device comprising:
a display panel;
a metal layer disposed on one surface of the display panel and including a first bending portion, and a first flat portion and a second flat portion disposed with the first bending portion interposed therebetween; and
an adhesive layer disposed on at least one edge of the metal layer,
wherein the adhesive layer includes a first extended portion, a second extended portion, and a third extended portion disposed along a first edge, a second edge, and a third edge of the first flat portion of the metal layer, respectively, the first to third extended portions defining an interior opening, wherein the metal layer includes an exposed region in which the adhesive layer is not disposed, the exposed region being disposed in the interior opening between the first extended portion and the third extended portion, the second extended portion and the third extended portion, and the first extended portion and the second extended portion in the first flat portion, wherein ends of the first extended portion and the second extended portion that are not connected to the third extended portion end near a boundary between the first bending portion and the first flat portion, and wherein an area where the adhesive layer is disposed on the metal layer is 30% or less of a sum of an areas of the first flat portion and the second flat portion of the metal layer.

15. The display device of claim 14, wherein:
the adhesive layer includes a material with a Young's modulus of 0.1 MPa or less.

16. The display device of claim 15, wherein:
the adhesive layer includes an acryl-based resin or a silicon-based resin.

17. The display device of claim 16, wherein:
the adhesive layer comprises a first adhesive layer disposed at the first flat portion of the metal layer and a second adhesive layer disposed at the second flat portion of the metal layer.

18. The display device of claim 17, wherein:
the adhesive layer is configured to deform when the first flat portion and the second flat portion move in opposite directions.

19. The display device of claim 1, further comprising:
a protection layer having elasticity and disposed between the display panel and the metal layer, and overlapping substantially the entire one surface of the display panel.

20. The display device of claim 14, further comprising:
a protection layer having elasticity and disposed between the display panel and the metal layer, and overlapping substantially the entire one surface of the display panel.

* * * * *